United States Patent [19]

Pezzani

[11] Patent Number: 5,272,363

[45] Date of Patent: Dec. 21, 1993

[54] BIDIRECTIONAL PROTECTION COMPONENT

[75] Inventor: Robert Pezzani, Vouvray, France

[73] Assignee: SGS-Thomson Microelectronics S.A., Gentilly, France

[21] Appl. No.: 896,005

[22] Filed: Jun. 10, 1992

[30] Foreign Application Priority Data

Jun. 11, 1991 [FR] France ............................ 91 07478

[51] Int. Cl.$^5$ .................... H01L 29/747; H03K 17/56; H02H 9/00
[52] U.S. Cl. ........................ 257/173; 257/121; 257/146; 307/631; 307/645; 363/54; 361/56
[58] Field of Search ............... 257/121, 173, 146; 307/631, 645, 646; 363/54, 57; 361/56

[56] References Cited

U.S. PATENT DOCUMENTS

| | | | |
|---|---|---|---|
| 4,282,555 | 8/1981 | Svedberg | 257/146 |
| 4,322,767 | 3/1982 | El Hamamsy et al. | 257/146 |
| 4,456,940 | 6/1984 | Hammerberg et al. | 361/56 |
| 4,467,344 | 8/1984 | Chang et al. | 257/146 |
| 4,742,380 | 5/1988 | Chang et al. | 257/173 |

Primary Examiner—Rolf Hille
Assistant Examiner—Robert Limanek
Attorney, Agent, or Firm—Lowe, Price, LeBlanc & Becker

[57] ABSTRACT

A bidirectional protection component comprises two reverse connected thyristors, each of which is in antiparallel with a diode, the gates of the two thyristors being interconnected and floating. This component, which can be monolithic comprises two vertical thyristors having the same orientation and two vertical diodes having the same orientation, opposite that of the thyristors. Semiconductor regions (P3, N2, P1) constituting the thyristors are common except for their cathode regions (N11, N12). The component comprises three metallizations: a rear surface metallization (M1) connecting the common anodes of the thyristors with the cathodes of the diodes, a first front surface metallization (A1) connecting the cathode (N11) of a thyristor to the anode (P21) of a diode, and a second front surface metallization (A2) connecting the cathode (N12) of the other thyristor to the anode (P22) of the other diode.

20 Claims, 5 Drawing Sheets

BIDIRECTIONAL PROTECTION COMPONENT

BACKGROUND OF THE INVENTION

The present invention relates to a bidirectional protection device and more particularly to such a device monolithically manufactured.

Such a device can be used for protecting electric or telephone lines from overvoltages by becoming conductive when the voltage at its terminals overcome a determined position or negative value.

FIG. 1 shows the current-voltage characteristic of a conventional bidirectional protection component. Considering the positive quadrant of this characteristic, when the voltage across the component reaches a value $V_{BO1}$, the current increases rapidly at a substantially constant voltage. Then, abruptly, the voltage across the component drops as the current increases. The current value stabilizes as a function of the series impedance of the circuit at a value $I_{ON}$ for which the voltage across the component has a low value $V_{ON}$. When the voltage across the component decreases, the current decreases down to a hold current value $I_H$ corresponding to a voltage value $V_H$. Below this value $I_H$, the component is again in the blocked state.

In the negative quadrant, the component has a similar characteristic.

There already exists numerous components having such characteristics. In the present application, one will consider a component having a low hold current, not higher than a few milliamperes, a breakdown voltage not higher than a few tens of volts, and a maximum current $I_{BO}$ for the breakdown voltage not higher than a few milliamperes. Moreover, it is desired to obtain a component such that the voltage drop in the conductive state, $V_{ON}$, is particularly low for low current values in the conductive state $I_{ON}$. It is also aimed at achieving a component in which the positive and negative breakdown voltages, $V_{BO1}$ and $V_{BO2}$, respectively, can be fixed independently. Such an independent setting of $V_{BO1}$ and $V_{BO2}$ is useful, for example, for protecting lines having different polarizations in a rated state.

SUMMARY OF THE INVENTION

To achieve these objects, the invention provides a bidirectional protection component comprising two reverse connected thyristors wherein each is in anti-parallel with a diode, in which the gates of the two thyristors are interconnected and floating.

According to an aspect of the invention, the monolithic bidirectional protection component comprises two vertical thyristors having the same orientation and two vertical diodes having the same orientation, opposite that of the thyristors. The semiconductor regions constituting the thyristors are common except for their cathode regions. This component comprises three metallizations: a rear surface metallization connecting the common anodes of the thyristors with the cathodes of the diodes, a first front surface metallization connecting the cathode of a thyristor with the anode of a diode, and a second front surface metallization connecting the cathode of the other thyristor with the anode of the other diode.

According to another aspect of the invention, the monolithic bidirectional protection component comprises two vertical thyristors having the same orientation and two lateral diodes having the same orientation, opposite that of the thyristors. The semiconductor regions constituting the thyristors are common, except for their cathode regions, the component comprising four metallizations: a rear surface metallization, a first front surface metallization connecting the cathode of a thyristor to the anode of a diode, a second front surface metallization connecting the cathode of the other thyristor to the anode of the other diode, and a third front surface metallization in contact with the anode region of the diodes, this third front surface metallization being intended to be connected to the rear surface metallization.

According to an embodiment of the invention, the distinct cathode regions of the two thyristors have distinct doping levels.

According to an embodiment of the invention, the anode region of the first diode, connected to the cathode region of the first thyristor, comprises an extension extending along the cathode region of the second thyristor and a similar arrangement is provided for the second diode and the first thyristor.

According to an implementation of the component with vertical diodes:

the vertical thyristors comprise, from the rear surface of the wafer, a first common region of a first conductivity type, a second common region of the second conductivity type, a third common region of the first conductivity type, and first distinct regions of the second conductivity type appearing at the surface of the front surface;

the vertical diodes comprise, from the rear surface to the front surface, a fourth common region of the second conductivity type, the second common region and second distinct regions of the first conductivity type; and front surface metallizations connect a distinct region of a thyristor to a distinct region of a diode and the other distinct region of a thyristor to the other distinct region of a diode, and a rear surface metallization connects the first and fourth common regions.

According to an implementation of the component with lateral diodes:

the vertical thyristors comprise, from the rear surface of the wafer, a first common region of the first conductivity type, a second common region of the second conductivity type, a third common region of the first conductivity type, and distinct regions of the second conductivity type appearing at the front surface;

the lateral diodes comprise, on the front surface side, a fourth common region of the second conductivity type with a high doping level and distinct regions of the first conductivity type formed in the second common region;

first front surface metallizations connect a distinct region of a thyristor to a distinct region of a diode and the other distinct region of a thyristor to the other distinct region of a diode;

a second metallization is formed on the fourth common region; and a rear surface metallization is provided to be connected to the second metallization.

BRIEF DESCRIPTION OF THE DRAWINGS

The foregoing and other objects, features and advantages of the invention will be apparent from the following detailed description of preferred embodiments as illustrated in the accompanying figures wherein:

As conventional in integrated circuit representation, FIGS. 3-6 are not drawn to scale, neither within one figure nor from one figure to another. Moreover, the shapes of the various regions are very schematic. Especially, they are drawn with square edges while, in practice, the various edges are rounded up, as a result of diffusion and annealing steps. In addition, in the figures, the same reference numerals designate similar or analogous layers or regions.

DETAILED DESCRIPTION OF THE INVENTION

Figure 1:
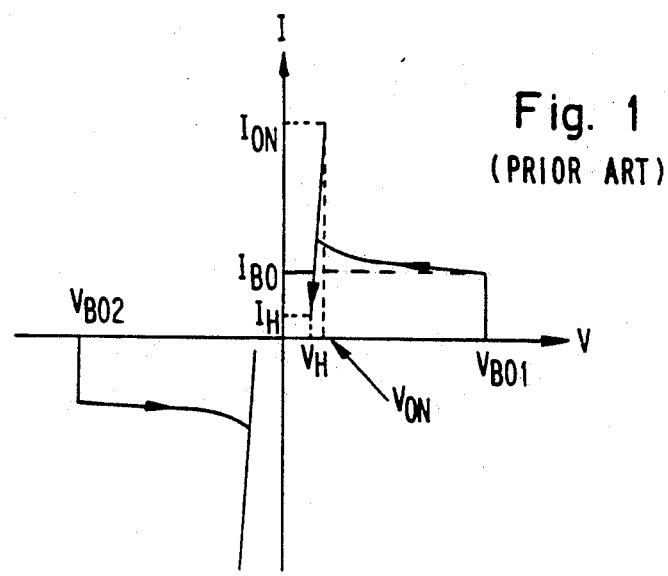
FIG. 1 shows the characteristic curve of a bidirectional protection component.
Figure 2:
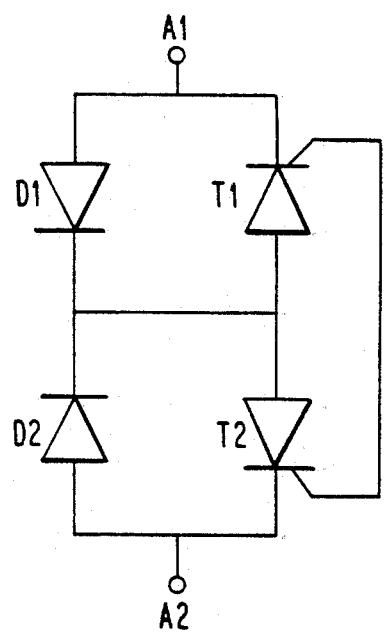
FIG. 2 shows the equivalent diagram of a bidirectional protection component according to the invention.

As shown in FIG. 2, a protection component according to the invention comprises two reverse connected cathode-gate thyristors T1 and T2. Each thyristor is connected in anti-parallel to a respective diode D1, D2. The gates of thyristors T1 and T2 are interconnected and electrically floating.

Assume that a positive overvoltage appears at terminal A1. As long as this overvoltage is low, the two thyristors T1 and T2 block and no current flows therein. When the voltage on terminal A1 exceeds the breakdown voltage of the reverse connected cathode-gate diode of thyristor T1 (plus the forward voltage drop of the gate-cathode diode of thyristor T2), current flows through the gate of thyristor T2 and this thyristor is turned on. The positive overvoltage then flows from terminal A1 to terminal A2, through diode D1 and thyristor T2. Similarly, a negative overvoltage will flow through thyristor T1 and diode D2.

Given the objects of the invention, for each thyristor T1 and T2, a sensitive thyristor will be chosen, that is, a thyristor without gate-cathode emitter shorts.

Figure 3A:
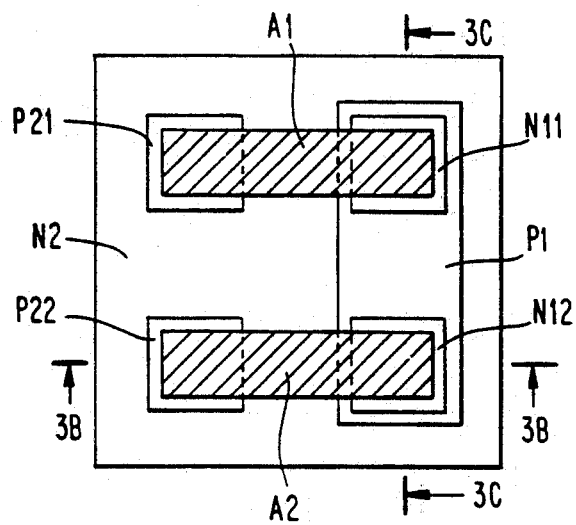
FIGS. 3A, 3B and 3C show in a top view and in two cross section views, respectively, an embodiment of a monolithic component according to the invention.
Figure 3B:
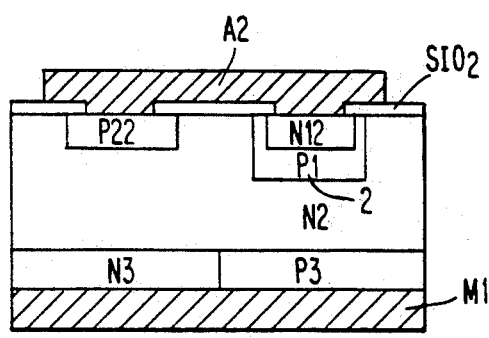
Figure 3C:
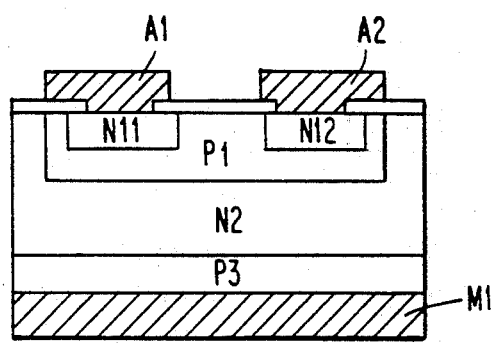

FIG. 3A is a schematic top view of a monolithic implementation of a component according to the invention. FIGS. 3B and 3C are cross section views along lines B—B and C—C of FIG. 3A, respectively. In this embodiment, the thyristors and diodes are of the vertical type. The thyristors comprise a common gate or emitter region, P1, formed in an N type substrate N2, on top of an anode layer P3. The N-type cathode regions, N11 and N12, respectively, of thyristors T1 and T2 are formed in the emitter region P1. The lower surface is covered with a metallization M1. Each diode D1 and D2 comprises on the upper surface side an anode region, P21 and P22, respectively, formed in layer N2 and, on the rear surface side, a more highly doped N-type region N3. Thus, one has formed thyristor T1 constituted by regions N11, P1, N2 and P3, thyristor T2 constituted by regions N12, P1, N2 and P3, diode D2 constituted by regions P21, N2 and N3, and diode D2 constituted by regions P22, N2 and N3. If regions N11 and N12 are differently doped, the breakdown voltages of junctions N11P1 and N12P1 will be distinct and it will therefore be possible to independently fix the breakdown voltages for the positive and negative overvoltages.

A metallization A1 connects the upper surfaces of regions N11 and P21 and a metallization A2 connects the upper surfaces of regions N12 and P22. In other words, metallization A1 connects the anode of diode D1 to the cathode of thyristor T1 and metallization A2 connects the anode of diode D2 to the cathode of thyristor T2. Metallization M1 connects the anodes of the thyristors to the cathodes of the diodes. The connection between the gates of the two thyristors is constituted by the common region P1. Therefore, the component of FIG. 3 actually corresponds to the equivalent diagram of FIG. 2.

Figure 4A:
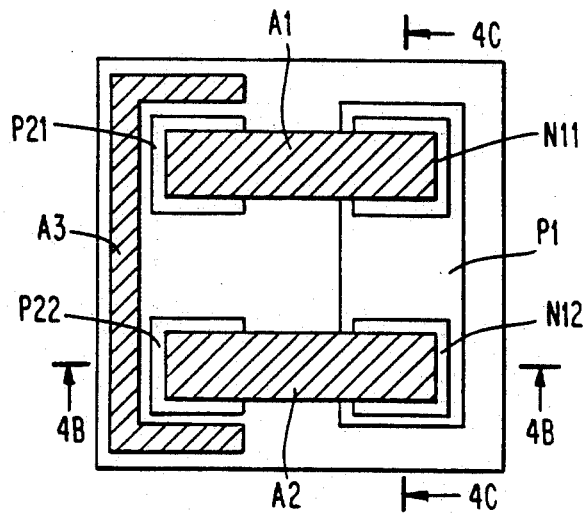
FIGS. 4A, 4B and 4C show in a top view and in two cross section views, respectively, another embodiment of a monolithic component according to the invention.
Figure 4B:
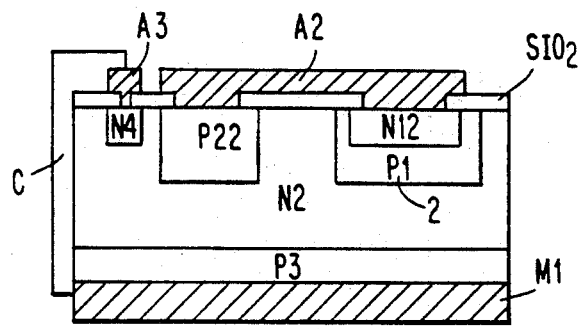
Figure 4C:
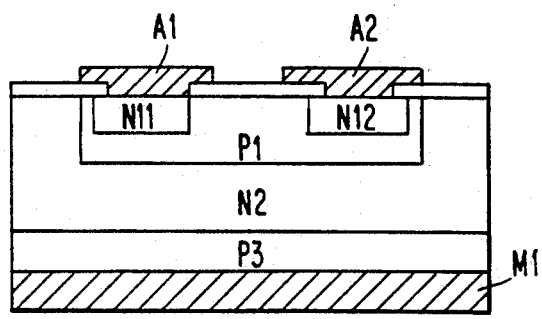

FIGS. 4A-4C respectively represent a top view, a cross section view along line B—B of FIG. 4A and a cross section view along line C—C of FIG. 4A of a second embodiment of the invention.

In the second embodiment, as in the first, thyristors T1 and T2 are of the vertical type but now diodes D1 and D2 are of the lateral type.

As will be noted by comparing FIGS. 4A-4C with FIGS. 3A-3C, the difference between both embodiments is that, in the second embodiment, the lower surface of the substrate is coated with a uniform P layer, P3, and the N3 layer illustrated above in FIG. 3B no longer appears. But, an N-type diffused region, N4, coated with a metallization A3, extends along regions P21 and P22. As a result, diodes D1 and D2 are respectively constituted by regions P21, N2, N4 and P22, N2, N4, these diodes being respectively formed between metallizations A1-A3 and A2-A3. In order to connect the cathodes (N4) of the diodes to the anodes (P3) of the thyristors, it is necessary to provide an external connection C between metallization A3 and metallization M1, as symbolically shown in FIG. 4B.

This second embodiment, which constitutes one aspect of the invention, exhibits numerous advantages over the first embodiment. It is simpler to manufacture since only the upper surface of the structure will be subject to photoetching steps, the lower surface being uniformly processed. This structure can be achieved from a silicon wafer, the substrate of which is constituted by the P3 region and wherein the N2 region is epitaxially grown, which enables thicker wafers with a larger diameter to be used since, because of their thickness, they are less fragile. Last, as known, since the surface of region N2 between regions P22 and N4 is smaller according to the embodiment shown in FIG. 4 than the thickness of region N2 between regions P22 and N3 in the case of FIG. 3B, the lateral diodes according to this second embodiment will have a lower overvoltage at the switching on than the vertical diodes of the first embodiment.

Figure 5A:
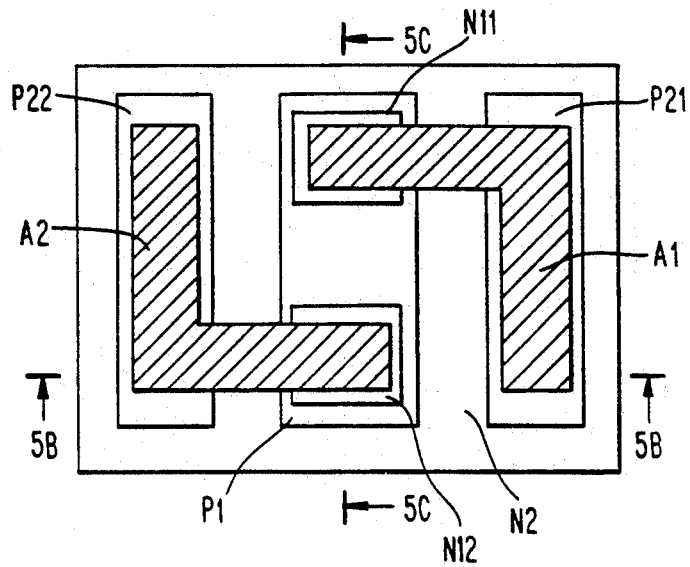
FIGS. 5A, 5B and 5C show in a top view and in two cross section views, respectively, a further embodiment of a monolithic component according to the invention.
Figure 5B:
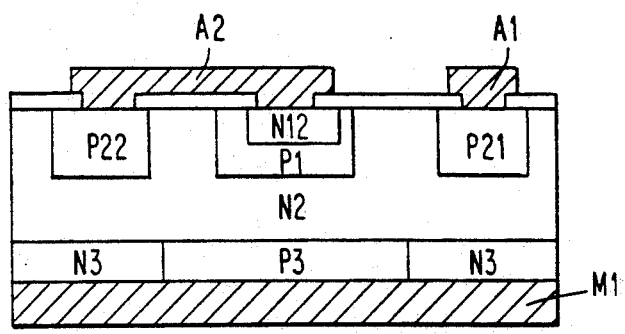
Figure 5C:
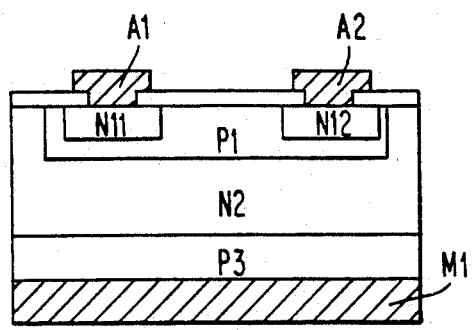
Figure 6A:
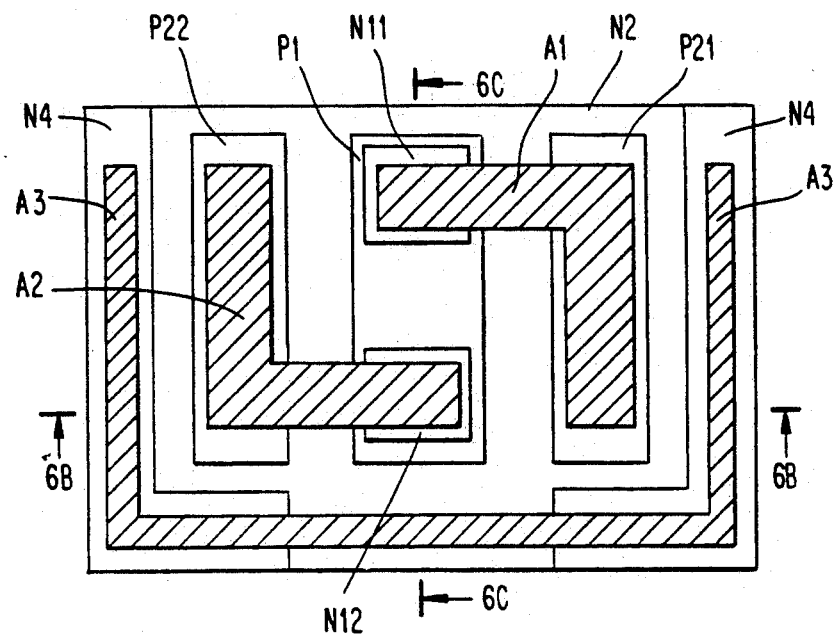
FIGS. 6A, 6B and 6C show in a top view and in two cross section views, respectively, yet another embodiment of a monolithic component according to the invention.
Figure 6B:
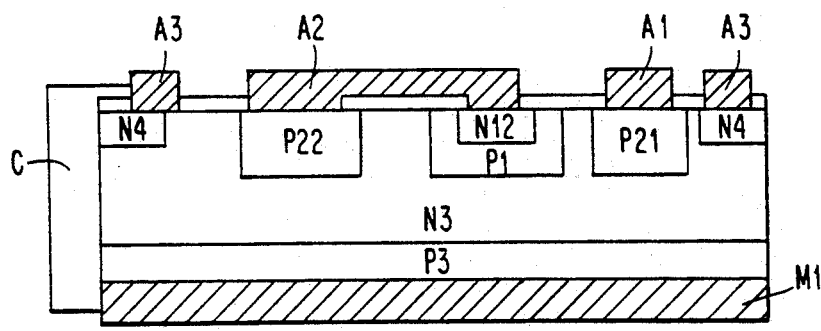
Figure 6C:
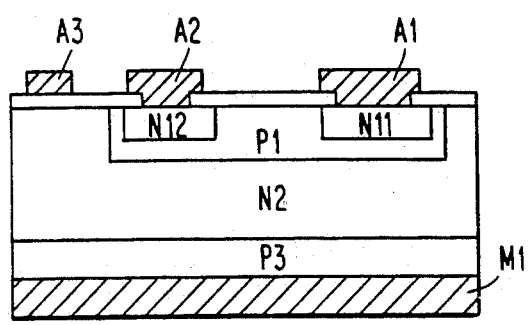

FIGS. 5 and 6 illustrate a modification brought to the embodiment shown in FIG. 3 and to the embodiment of FIG. 4, respectively. This modification constitutes one aspect of the invention.

This other embodiment of the invention is not differentiated from the former realizations in the cross section views (FIGS. 5B, 5C on the one hand and 6B, 6C on the other are very similar to FIGS. 3B, 3C on the one hand and 4B, 4C on the other) but in their layout, as seen in the top views of FIGS. 5A and 6A.

More particularly, this aspect of the invention lies in the provision of an extension of the anode regions P21 and P22 of diodes D1 and D2 in front of the gate region (region P1) of the thyristor to which each of these diodes is not connected. Thus, region P22 of diode D2 extends in front of region P1 corresponding to thyristor T1 and region P21 of diode D1 extends in front of region P1 corresponding to thyristor T1. Hence, as shown in FIGS. 5B and 6B, in addition to the series connection of thyristor T2 and diode D2, a lateral thyristor T'2, formed by region N12, region P1, region N2 and region P21, appears between terminals A2 and A1. Thyristor T'2 has the same orientation as thyristor T2 in series with diode D1. Similarly, a lateral thyristor T'1 constituted by regions N11, P1, N2 and P22 appears between electrodes A1 and A2 with the same polarity as thyristor T1 in series with diode D2.

Figure 7:
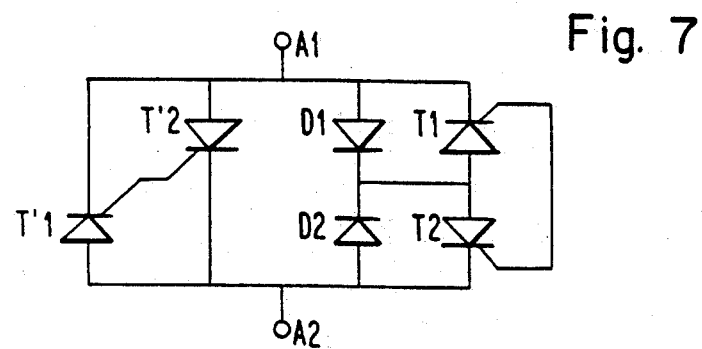
FIG. 7 represents the equivalent diagram of a monolithic component as shown in FIG. 5 or 6.

The equivalent diagram of the circuits of FIGS. 5 and 6 is shown in FIG. 7. This equivalent diagram shows again the assembly of components D1, D2, T1, T2 connected as in FIG. 2 but to which are added thyristors T'1 and T'2 connected in anti-parallel between terminals A1 and A2, the gates of thyristors T'1 and T'2 being connected. The common gate region of thyristors T'1 and T'2 is again region P1.

The lateral thyristors T'1 and T'2 turn on simultaneously with the vertical thyristors T1 and T2, respectively. They exhibit the advantage that, when the current between terminals A1 and A2 is low, in the on state, the voltage drop at their terminals is lower than the voltage drop across the series connection of a diode and a thyristor (D1 and T2 or D2 and T1). But, when the current is high, these lateral thyristors have a higher resistance at the conductive state than thyristors T1 and T2 and the current will tend to preferably flow in the series connection of diode D2 and thyristor T1 or of diode D1 and thyristor T2 according to the overvoltage direction. Thus, a protection device constituted according to this aspect of the invention has the advantage of absorbing high overvoltages due to thyristors T1 and T2 and having a very small voltage drop E for low currents due to thyristors T'1 and T'2.

Of course, the invention is liable of numerous variants and modifications which will appear to those skilled in the art, especially as regards the configuration of the various layers shown in the top view. For example, in FIG. 4A, metallization A3 can be devised so as to surround the whole component. In the various figures, various interdigitated patterns of the layers can be devised to improve interaction between the different elements. In FIG. 6A, diffusion N4 is shown as interrupted at the bottom of the figure. This diffusion N4 can be extended. It also can symmetrically surround the component. Similarly, those skilled in the art will be able to select the relative surfaces of the various regions and the values of these surfaces as well as the diffusion levels so as to obtain predetermined triggering voltages and power characteristics.

By way of example, it is possible, in the embodiment of FIG. 6, to choose for the various regions the following approximate values for doping level, superficial concentration ($C_S$), or resistivity:

| | |
|---|---|
| substrate P3 | concentration higher than $10^{18}$ at/cm³ |
| epitaxial N2 region | resistivity of a few ohms.cm |
| diffusions P1, P21 and P22 | $C_s = 10^{18}$ at/cm³ |
| diffusion N12 | $C_s = 10^{20}$ at/cm³ |
| diffusion N22 | $C_s = 2 \cdot 10^{20}$ at/cm³ |
| diffusion N4 | $C_s = 10^{20}$ at/cm³ |

With these doping levels, the protection component will have the following characteristics:

| | |
|---|---|
| $V_{BO1}$ (in the positive direction) | 18 V |
| $V_{BO2}$ (in the negative direction) | 15 V |
| $V_{ON}$ (for $I_{ON} = 10$ mA) | lower than 1 V |
| $V_{ON}$ (for $I_{ON} = 10$ A) | lower than 3 V |
| $I_H$ | lower than 1 mA |
| $I_{BO}$ | lower than 1 mA |

I claim:

1. A bidirectional protection component comprising, in series, two reverse connected thyristors (T1, T2), each of which is in anti-parallel with a corresponding unidirectional device (D1, D2), wherein the gates of said two thyristors are interconnected and floating.

2. A bidirectional monolithic protection component comprising
    two vertical thyristors (T1, T2) having the same orientation and wherein semiconductor regions (P3, N2, P1) constituting said thyristors are common except for their cathode regions (N11, N12);
    two vertical diodes (D1, D2) having the same orientation, opposite that of said thyristors;
    a rear surface metallization (M1) connecting the common anodes of the thyristors with the cathodes of the diodes;
    a first front surface metallization (A1) connecting the cathode (N11) of a thyristor to the anode (P21) of a diode; and
    a second front surface metallization (A2) connecting the cathode (N12) of the other thyristor to the anode (P22) of the other diode.

3. A bidirectional monolithic protection component comprising
    two vertical thyristors (T1, T2) having the same orientation and wherein the semiconductor regions constituting said thyristors are common except for their cathode regions (N11, N12);
    two lateral diodes (D1, D2) having the same orientation, opposite that of said thyristors;
    a rear surface metallization (M1);
    a first front surface metallization (A1) connecting the cathode of a thyristor to the anode of a diode;
    a second front surface metallization (A2) connecting the cathode of the other thyristor to the anode of the other diode; and
    a third front surface metallization (A3) in contact with the anode region of the diodes, said third front surface metallization being intended to be connected to the rear surface metallization.

4. A bidirectional protection component according to claim 2, wherein the cathode regions of said two thyristors have distinct doping levels.

5. A bidirectional protection component according to claim 2, wherein
    said anode region (P21) of said first diode, connected to the cathode region (N11) of the first thyristor (T1), comprises an extension extending in front of the cathode region (N12) of the second thyristor; and said anode region (P22) of said second diode, connected to the cathode region (N12) of the second thyristor (T2), comprises an extension extending along the cathode region (N11) of the first thyristor (FIG. 5A, FIG. 6A).

6. A bidirectional protection component according to claim 2, wherein said vertical thyristors (T1, T2) comprise, from the rear surface of the wafer, a first common region (P3) of a first conductivity type, a second common region (N2) of the second conductivity type, a third common region (P1) of the first conductivity type and, first distinct regions (N11, N12) of the second conductivity type appearing on the front surface;

the vertical diodes comprise, from the rear surface to the front surface, a fourth common region (N3) of the second conductivity type, the second common region (N2) and second distinct regions (P21, P22) of the first conductivity type;

front surface metallizations (A1 and A2) connect a distinct region of a thyristor to a distinct region of a diode and the other distinct region of a thyristor to the other distinct region of a diode; and a rear surface metallization (M1) connects said first and fourth common regions.

7. A bidirectional monolithic protection component according to claim 3, wherein:

said vertical thyristors (T1, T2) comprise, from the rear surface of the wafer, a first common region (P3) of the first conductivity type, a second common region (N2) of the second conductivity type, a third common region (P1) of the first conductivity type, and distinct regions (N11, N12) of the second conductivity type appearing on the front surface;

said lateral diodes comprise, on the front surface side, a fourth highly doped common region (N4) of the second conductivity type and distinct regions (P21, P22) of the first conductivity type formed in said second common region (N2);

first front surface metallizations (A1, A2) connect a distinct region of a thyristor with a distinct region of a diode and the other distinct region of a thyristor with the other distinct region of a diode;

a second metallization is formed on the fourth common region; and a rear surface metallization is provided to be connected to said second metallization.

8. The component of claim 1, wherein said unidirectional devices comprise diodes.

9. The component of claim 1, wherein said component is monolithic, being formed in a semiconductor substrate.

10. The component of claim 9, wherein layers of said thyristors are oriented vertically in said substrate.

11. The component of claim 10, wherein layers of said unidirectional devices are oriented vertically in said substrate.

12. The component of claim 11, wherein layers of said unidirectional devices are oriented laterally in said substrate.

13. A bidirectional protection component, comprising:

a series connection of first and second reverse-connected thyristors, each of which is in anti-parallel with a corresponding unidirectional device, and third and fourth thyristors connected across said series connection and in anti-parallel with each other.

14. The component of claim 13, wherein gates of said first and second thyristors are connected to each other and floating.

15. The component of claim 14, wherein gates of said third and fourth thyristors are connected to each other and floating.

16. The component of claim 13, wherein said unidirectional devices comprise diodes.

17. The component of claim 13, including a semiconductor substrate, layers of said first and second thyristors being oriented vertically in said substrate.

18. The component of claim 17, wherein layers of said third and fourth thyristors are oriented laterally in said substrate.

19. The component of claim 17, wherein layers of said unidirectional devices are oriented vertically in said substrates.

20. The component of claim 17, wherein layers of said unidirectional devices are oriented laterally in said substrate.

* * * * *